United States Patent
Maruko et al.

(10) Patent No.: US 10,793,945 B2
(45) Date of Patent: Oct. 6, 2020

(54) POWDER COATING APPARATUS

(71) Applicant: FURUYA METAL CO., LTD., Tokyo (JP)

(72) Inventors: Tomohiro Maruko, Tokyo (JP); Keiichiro Jinushi, Tokyo (JP); Amiko Ito, Tokyo (JP)

(73) Assignee: FURUYA METAL CO., LTD., Tokyo (JP)

( * ) Notice: Subject to any disclaimer, the term of this patent is extended or adjusted under 35 U.S.C. 154(b) by 214 days.

(21) Appl. No.: 15/746,282

(22) PCT Filed: Jul. 22, 2016

(86) PCT No.: PCT/JP2016/071587
§ 371 (c)(1),
(2) Date: Jan. 19, 2018

(87) PCT Pub. No.: WO2017/014304
PCT Pub. Date: Jan. 26, 2017

(65) Prior Publication Data
US 2018/0223414 A1 Aug. 9, 2018

(30) Foreign Application Priority Data

Jul. 22, 2015 (JP) ................................. 2015-145132

(51) Int. Cl.
*C23C 14/34* (2006.01)
*C23C 14/22* (2006.01)
(Continued)

(52) U.S. Cl.
CPC .......... *C23C 14/223* (2013.01); *C23C 14/185* (2013.01); *C23C 14/3407* (2013.01);
(Continued)

(58) Field of Classification Search
CPC .................. H01J 37/32761; C23C 14/223
See application file for complete search history.

(56) References Cited

U.S. PATENT DOCUMENTS

| 4,940,523 A * | 7/1990 | Takeshima ................ B22F 1/02 |
| | | 204/192.12 |
| 6,220,203 B1 | 4/2001 | Burger et al. |

(Continued)

FOREIGN PATENT DOCUMENTS

| CN | 101880861 | 11/2010 |
| EP | 0345795 | 12/1989 |

(Continued)

OTHER PUBLICATIONS

Extended European Search Report dated Mar. 25, 2019 in corresponding European Patent Application No. 16827864.6, 7 pages.
(Continued)

*Primary Examiner* — Jason Berman
(74) *Attorney, Agent, or Firm* — Ohlandt, Greeley, Ruggiero & Perle, L.L.P.

(57) ABSTRACT

A powder coating apparatus which can form a thin film in which freely selected elements are combined without an impurity being mixed and satisfies that a composition of the obtained thin film is uniform. The powder coating apparatus according to the present invention is a powder coating apparatus including a barrel, exhaust device for evacuating an inside of the barrel, and a sputtering device installed inside the barrel, the barrel having a main axis C directed in a horizontal direction and rotating around the main axis, the sputtering device forming a coating film on a surface of powder put in the barrel, in which the sputtering device has one fixing portion for one target to mount two or more targets, and respective targets are disposed in parallel to each other at the same level position with respect to a direction of (Continued)

the main axis when the target is mounted on the fixing portion.

16 Claims, 10 Drawing Sheets

(51) Int. Cl.
    *H01J 37/34*     (2006.01)
    *C23C 14/35*     (2006.01)
    *C23C 14/18*     (2006.01)
    *H01J 37/32*     (2006.01)
    *H01M 4/88*     (2006.01)

(52) U.S. Cl.
    CPC ........ *C23C 14/3464* (2013.01); *C23C 14/352* (2013.01); *H01J 37/32761* (2013.01); *H01J 37/3417* (2013.01); *H01M 4/8871* (2013.01)

(56) References Cited

U.S. PATENT DOCUMENTS 7,632,355 B2 * 12/2009 Toth .......................... B22F 1/02
                                                              118/716
2011/0064875 A1     3/2011   Sudo et al.

FOREIGN PATENT DOCUMENTS

| EP | 1224242 | 9/2010 |
|---|---|---|
| GB | 1497782 | 1/1978 |
| JP | 63096268 A * | 4/1988 |
| JP | 11-61399 | 3/1993 |
| JP | 5-271922 | 10/1993 |
| JP | 8-81767 | 3/1996 |
| JP | 8-325723 | 12/1996 |
| JP | 11-116842 | 4/1999 |
| JP | 2000-506226 | 5/2000 |
| JP | 4183098 | 9/2008 |
| JP | 2011-58071 | 3/2011 |
| JP | 2012-182067 | 9/2012 |
| JP | 2014-159623 | 9/2014 |

OTHER PUBLICATIONS

Notification of Transmittal of Translation of the International Preliminary Report on Patentability dated Feb. 1, 2018 from corresponding International PCT Application PCT/JP2016/071587, 9 pages.
Chinese Office Action dated Jun. 5, 2019 in corresponding Chinese Patent Application No. 201680042487.7, 12 pages.
International Search Report dated Aug. 30, 2016 from corresponding International PCT Application PCT/JP2016/071587, 2 pages.
Chinese Office Action dated Mar. 9, 2020 from corresponding Chinese Patent Application No. 201680042487.7, 11 pages.
Korean Office Action dated Nov. 12, 2019 in corresponding Korean Patent Application No. 10-2018-7001157, 15 pages.

* cited by examiner (a)

(b)

(c)

POWDER COATING APPARATUS

BACKGROUND

1. Field of the Disclosure

The present disclosure relates to a powder coating apparatus for coating a surface of each particle of powder with a thin film.

2. Discussion of the Background Art

A surface of a particle is coated with a thin film to impart functionality to powder in some cases. A sputtering method is mentioned as a technology for coating by a dry method, and various powder coating apparatuses using the sputtering method have been proposed (for example, see Patent Literatures 1 to 4).

Patent Literature 1 discloses a technology for sputtering platinum onto carbon powder using a sputtering device that includes a rotating barrel whose inside is kept in a vacuum, a target unit disposed in the rotating barrel, and a direct current sputtering power supply connected to the target unit and capable of generating plasma. Here, a target is sputtered and coated while the rotating barrel is rotated.

Patent Literature 2 discloses a technology for coating various types of metal on a surface of magnetic powder using a sputtering device having a rotating barrel.

Patent Literature 3 discloses a powder coating apparatus that forms a uniform coating layer on a powder particle surface while stirring raw material powder charged in a rotating drum and scraping off raw material powder adhering to an inner wall of the drum.

Patent Literature 4 discloses a powder coating apparatus in which a tubular rotating container is disposed in a vacuum container since a structure becomes complicated when the vacuum container is rotated.

Further, all the technologies described in Patent Literatures 1 to 4 relate to a unit sputtering device including only one sputtering target.

Patent Literature

Patent Literature 1: JP 2012-182067 A
Patent Literature 2: JP 4183098 B1
Patent Literature 3: JP 5-271922 A
Patent Literature 4: JP 2014-159623 A

SUMMARY

Currently, a demand for functional powder coated with various materials on a surface of a powder particle has been increasing in fields such as catalysts, fuel cells, and so on. When development is conducted for these uses, material search needs to be performed using various compositions obtained by combining a plurality of elements. However, if an alloy film or a laminated film is to be formed on a particle surface of powder using a powder sputtering device including a unit target disclosed in Patent Literatures 1 to 4, it is inevitable to perform film formation using the following methods.

Now, the first method is a method of performing sputtering by exchanging a target during film formation. In this method, a laminated film in which different compositions are laminated can be formed. However, since a uniform composition is not obtained in a thickness direction of the film, an alloy thin film is not formed. In addition, gas may be mixed as an impurity since powder is exposed to the atmosphere each time a target is exchanged, and a problem arises in that powder or a coated part, which has been formed, is oxidized or nitrided.

The second method is a method of producing an alloy target having a required composition and performing sputtering. In this case, it is possible to control a composition of a film by controlling the composition of the target. However, since it is possible to respond to only a material that can produce a target, this method can not be applied when a target can not be produced. For example, it is difficult to produce a target having a composition in which elements largely different in melting point are combined. In addition, in the case of obtaining a thin film having a new alloy composition by changing content of one material, it is necessary to start from production of an alloy target having a new composition.

The third method is a method of producing a target in which small pieces of each compositions are disposed in a mosaic pattern and performing sputtering. In this case, even a composition incapable of producing an alloy target allows application. However, precise composition control is not possible, and thus a composition of an obtained thin film is likely to be nonuniform.

In this regard, an object of the present disclosure is to provide a powder coating apparatus that solves a problem that could not be avoided in the case of using the unit sputtering device described in Patent Literatures 1 to 4, that is, a powder coating apparatus which can form a thin film in which freely selected elements are combined without an impurity being mixed and satisfies that a composition of the obtained thin film is uniform.

As a result of keen examination, the present inventors have found that the above-mentioned can be solved by adopting a multi-source sputtering device and setting a specific arrangement relation between two or more targets in a rotating barrel, and have completed the present disclosure. That is, a powder coating apparatus according to the present disclosure includes: a barrel; exhaust means which evacuates an inside of the barrel; and a sputtering device installed inside the barrel and having at least one target, the barrel having a main axis directed in a horizontal direction and rotating around the main axis, the sputtering device forming a coating film on a surface of powder put in the barrel, wherein the sputtering device has one fixing portion for one target to mount two or more targets, and respective targets are disposed in parallel to each other at the same level position with respect to a direction of the main axis when the target is mounted on the fixing portion.

In the powder coating apparatus according to the present disclosure, it is preferable that when target surfaces are projected toward an inner side wall of the barrel in parallel with normal lines of the target surfaces, the respective targets are directed in a direction in which projections overlap each other before reaching the inner side wall. Since elements (sputtered particles) jumping out from the respective targets arrive in a state of being more mixed with the powder put in the barrel, it is possible to form a thin film uniformly incorporating the respective elements from the respective targets on the surface of the powder particle.

In the powder coating apparatus according to the present disclosure, the respective targets include modes in which compositions are different from each other. When the compositions of the respective targets are made different from each other, it is possible to easily form an alloy film, a double oxide film, a double nitride film, a double carbide film, etc., and to reduce composition unevenness of the film.

In the powder coating apparatus according to the present disclosure, it is preferable that respective fixing portions are incorporated in a target unit to fix a relative orientation relation of the respective mounted targets, and the target unit is attached to be rotatable around the main axis. Even though the powder gradually rises when the barrel is rotated, an angle of the target unit can be adjusted in response to a degree of the gradual rise.

In the powder coating apparatus according to the present disclosure, it is preferable to further include: a powder rising suppression component disposed in contact with a side wall of a part of the inner side wall of the barrel which moves upward by rotation of the barrel to determine an upper limit position to which the powder gradually rises; and a leveling component for the powder disposed at an interval from the inner side wall of the barrel at a position lower than the powder rising suppression component to perform swinging motion about the main axis as a rotation center. It is possible to suppress the powder from rotating together with the barrel due to rotation of the barrel. In addition, since an upper limit position of gradual rise of the powder is determined, the sputtered particles may be efficiently applied to the powder. Further, since the powder is likely to have a mountain shape due to rotation of the barrel, the sputtered particle may be easily uniformly applied to the whole powder by leveling a crest.

In the powder coating apparatus according to the present disclosure, it is preferable that the powder rising suppression component corresponds to a brush or a spatula. The brush or the spatula may efficiently scrape off the powder from the barrel.

In the powder coating apparatus according to the present disclosure, it is preferable that the leveling component corresponds to a bar or a plate. The bar or the plate may easily uniformly level the powder having the mountain shape.

In the powder coating apparatus according to the present disclosure, it is preferable that when the leveling component performs swinging motion in an opposite direction to a rotation direction of the barrel, the leveling component turns back at a lowest position on the inner side wall of the barrel or a position beyond the lowest position. The leveling component may uniformly level the whole powder.

In the powder coating apparatus according to the present disclosure, it is preferable that when the leveling component performs swinging motion along the rotation direction of the barrel, the leveling component turns back below the powder rising suppression component. The leveling component may agitate the whole powder while passing through the powder.

In the powder coating apparatus according to the present disclosure, it is preferable that the sputtering device is capable of rotating about the main axis to adjust an angle. Even though a place in which the powder is likely to gather changes depending on the type of the powder and the rotation condition of the barrel, a sputtering surface is more likely to be directed to a place in which density of the powder is high.

In the powder coating apparatus according to the present disclosure, it is preferable that the powder rising suppression component is fixed by being connected to a portion of the sputtering device corresponding to neither the target nor a part electrically connected to the target or by being connected to a part modularized with the sputtering device. A mounting structure of the powder rising suppression component may be simplified. Further, when the inclination of the sputtering device is made variable, the powder rising suppression component moves in conjunction with inclining movement of the sputtering device, and thus a relative positional relation between the target and the powder rising suppression component may be kept constant.

In the powder coating apparatus according to the present disclosure, it is preferable that when a position of each of the powder rising suppression component, the leveling component, and the target is represented on polar coordinates on a cross section vertically traversing the main axis and passing through the powder rising suppression component, the leveling component, and the targets, a position of the main axis is set to an origin O of the polar coordinates, a vertical downward line passing through the main axis is set to a start line of an angle 0°, and the rotation direction of the barrel is set to a direction forming a positive angle with respect to the start line, and when an angle at which the powder rising suppression component is fixed is set to $\beta$, an angle 1 of a line corresponding to a normal line of a target surface located at a center or an extension line thereof and intersecting the main axis is set to $\theta$ in a case in which an odd number (however, excluding 1) of targets are provided on the cross section, or an angle 2 of a line connecting the main axis and a point at which normal lines of two target surfaces located at a center or extension lines thereof intersect each other is set to $\theta$ in a case in which an even number of targets are provided on the cross section, and a maximum angle of a swing width of swinging of the leveling component is set to $\alpha_1$ in a positive direction and to $\alpha_2$ in a negative direction with respect to a line having the angle $\theta$, the angle $\beta$, the angle $\theta$, the angle $\alpha_1$, and the angle $\alpha_2$ satisfy Formula 1, Formula 2, Formula 3, and Formula 4:

$$0° < \beta - (\theta + \alpha_1) < 45° \quad \text{(Formula 1)}$$

$$90° \leq \beta < 135° \quad \text{(Formula 2)}$$

$$0° \leq \theta \leq 45° \quad \text{(Formula 3)}$$

$$0° < \alpha_2 < 60° \quad \text{(Formula 4).}$$

In a multi-source sputtering device that simultaneously sputters a plurality of types of targets, even though a direction in which sputtered particles advance is different according to a type of target, it is possible to further level the surface of the powder. As a result, the sputtered particle may be easily uniformly applied to the whole powder.

In the powder coating apparatus according to the present disclosure, it is preferable to further include a first angle adjustment mechanism which changes an inclination $\theta$ of the target and is capable of fixing the inclination at any angle in an angle range of Formula 3. According to the first angle adjustment mechanism, when the target is inclined and fixed at any angle in the angle range of Formula 3, a position of the powder rising suppression component may be moved in conjunction therewith by the same angle as an angle of the inclination.

In the powder coating apparatus according to the present disclosure, it is preferable that the powder rising suppression component is fixed while being disposed above an intersecting part between a line extending the target surface located at the center and the inner side wall of the barrel in the case in which the odd number (however, excluding 1) of targets are provided on the cross section, or is fixed while being disposed above an intersecting part between a line connecting both ends of the two target surfaces located at the center facing each other and the inner side wall of the barrel in the case in which the even number of targets are provided on the cross section. It is possible to suppress the powder rising suppression component from being contaminated by sputtering.

In the powder coating apparatus according to the present disclosure, it is preferable to further include a first angle adjustment mechanism which changes an inclination θ of the target and is capable of fixing the inclination at any angle in an angle range of Formula 3, wherein the powder coating apparatus further includes a second angle adjustment mechanism capable of fixing the powder rising suppression component at a variable position above an intersecting part between a line extending the target surface located at the center and the inner side wall of the barrel in the case in which the odd number (however, excluding 1) of targets are provided on the cross section, or the powder coating apparatus further includes a second angle adjustment mechanism capable of fixing the powder rising suppression component at a variable position above an intersecting part between a line connecting both ends of the two target surfaces located at the center facing each other and the inner side wall of the barrel in the case in which the even number of targets are provided on the cross section. It is possible to adjust a fixing position of the powder rising suppression component independently of the inclination of the target and to suppress the powder rising suppression component from being contaminated by sputtering.

In the powder coating apparatus according to the present disclosure, it is preferable to further include a first angle adjustment mechanism capable of fixing the target at a variable position in a range of including or partially overlapping the target by 0° or more and $\theta_{MAX}$ or less (where, $\theta_{MAX}$ satisfies Formula 5), wherein the powder rising suppression component is fixed at a position above an intersecting part between a line extending the target surface located at the center and the inner side wall of the barrel when an inclination of the target is set to $\theta_{MAX}$ in the case in which the odd number (however, excluding 1) of targets are provided on the cross section, or is fixed at a position above an intersecting part between a line connecting both ends of the two target surfaces located at the center facing each other and the inner side wall of the barrel when an inclination of the target is set to $\theta_{MAX}$ in the case in which the even number of targets are provided on the cross section:

$$0° < \theta_{MAX} \leq 45°$$ (Formula 5).

It is possible to suppress the powder rising suppression component from being contaminated by sputtering regardless of the inclination of the target.

According to the present disclosure, it is possible to provide a powder coating apparatus which can form a thin film in which freely selected elements are combined without an impurity being mixed and satisfies that a composition of the obtained thin film is uniform.

BRIEF DESCRIPTION OF THE DRAWINGS

FIG. 7 is a schematic view illustrating another example of a cross-sectional shape of the leveling component, in which FIG. 7(a) illustrates an example in which the leveling component has a plate shape, FIG. 7(b) illustrates a first example of a case in which the leveling component has a semicircular cross section, and FIG. 7(c) illustrates a second example of the case in which the leveling component has a semicircular cross section.

DETAILED DESCRIPTION OF THE PREFERRED EMBODIMENT

Hereinafter, even though the present disclosure will be described in detail by showing embodiments, the present disclosure is not interpreted as being limited to these descriptions. The embodiments may be variously modified as long as effects of the present disclosure are exhibited.

Figure 1:
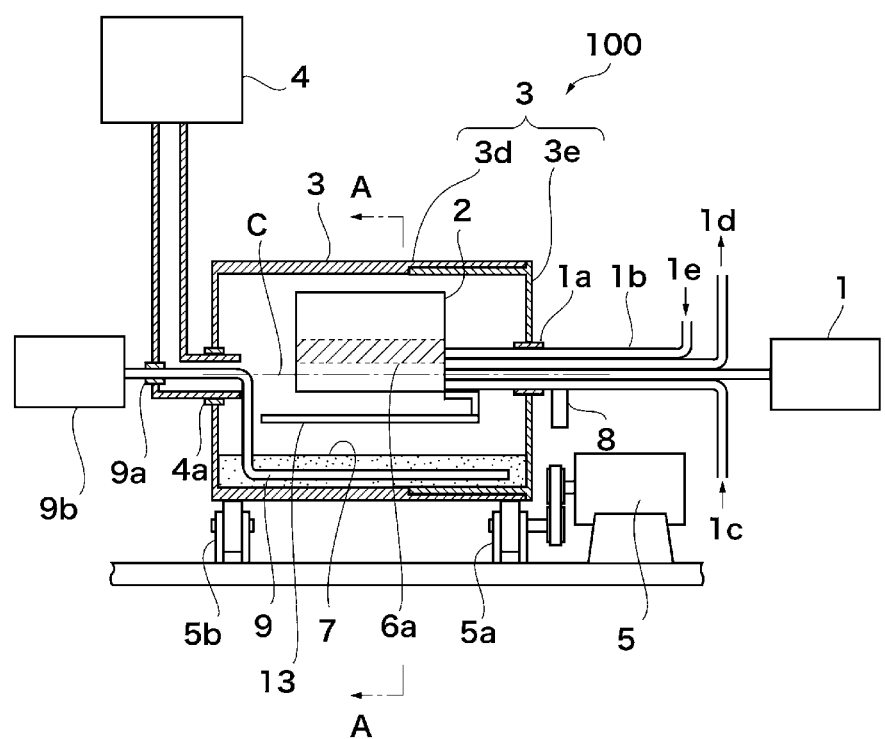
FIG. 1 is an overall configuration diagram of a powder coating apparatus according to the present embodiment.
Figure 2:
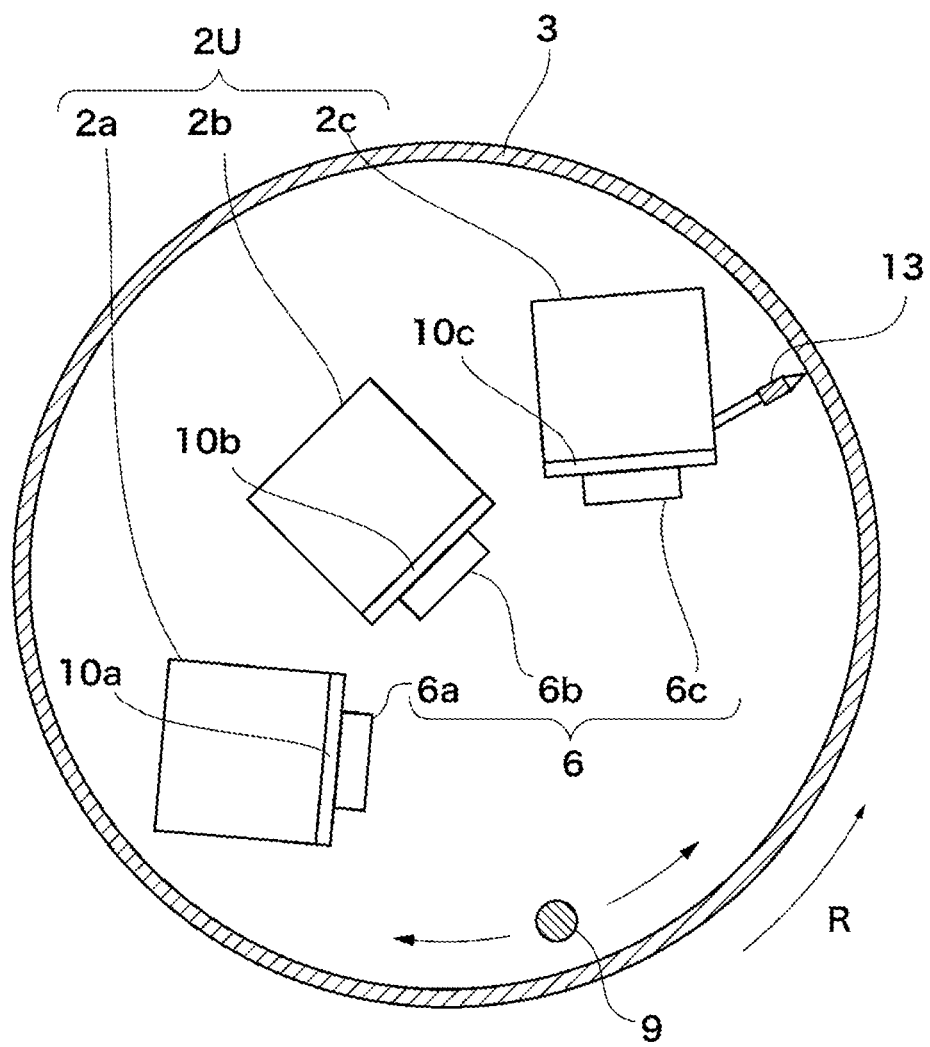
FIG. 2 is a schematic view of a cross section taken along line A-A of a target unit, a barrel, a powder rising suppression component and a leveling component.
Figure 3:
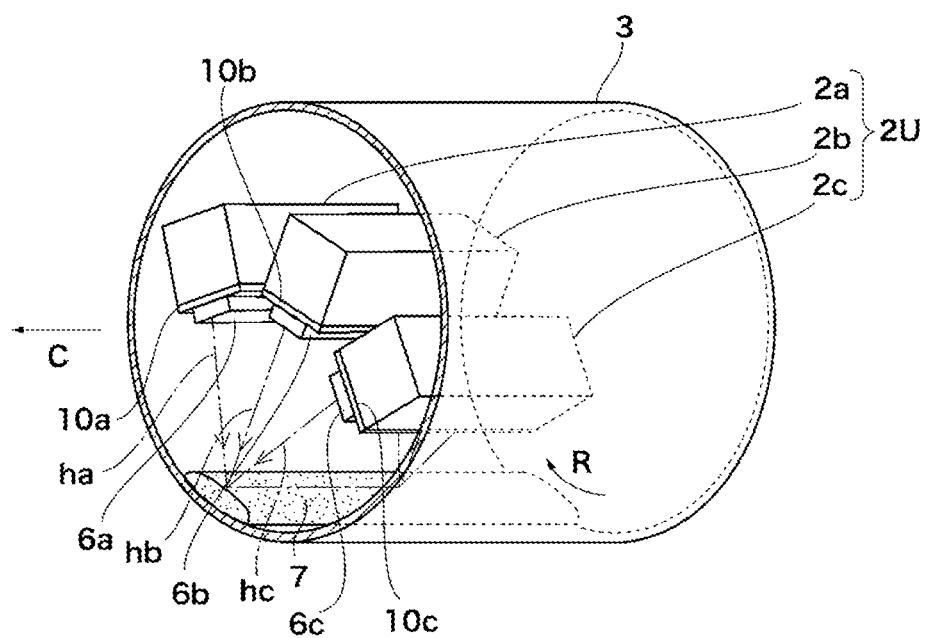
FIG. 3 is a schematic perspective view of the target unit and the barrel.

First, FIGS. 1 to 3 will be referred. FIG. 1 is an overall configuration diagram of a powder coating apparatus according to the present embodiment. FIG. 2 is a schematic view of a cross section taken along line A-A of a target unit, a barrel, a powder rising suppression component and a leveling component. FIG. 3 is a schematic perspective view of the target unit and the barrel. As illustrated in FIG. 1, a powder coating apparatus 100 according to the present embodiment includes a barrel 3, exhaust means 4 that evacuates an inside of the barrel 3, a sputtering device 2 which is installed inside the barrel 3 and has at least one target 6, the barrel 3 has a main axis C directed in a horizontal direction and rotates around the main axis C, and the sputtering device 2 forms a coating film on a surface of powder 7 put into the barrel 3. Here, as illustrated in FIG. 2, the sputtering device 2 has one fixing portion 10 (10a, 10b, and 10c) for one target to mount two or more targets 6 (6a, 6b, and 6c, three in FIG. 2). In addition, as illustrated in FIG. 3, in the sputtering device 2, when the targets 6 (6a, 6b, and 6c) are mounted on the fixing portions 10 (10a, 10b, and 10c), the respective targets 6a, 6b, and 6c are disposed in parallel to one another at the same level position with respect to a direction of the main axis C.

The powder coating apparatus 100 according to the present embodiment is a rotating barrel type multi-source sputtering device capable of applying a coating to an entire particle surface of powder. In this device, two or more targets can be sputtered at the same time, and each target is individually connected to a power supply 1. It is preferable to connect one target to one power supply. For example, when two or more types of targets are mounted, it is possible to simultaneously sputter a plurality of substances. In addition, since each target can individually adjust an output, sputtering may be performed at an arbitrary ratio.

The barrel 3 is supported by a driving roll 5a and a driven roll 5b. The driving roll 5a may be rotated using the main axis C of the barrel 3 as a horizontal axis by receiving power from a drive motor 5. The barrel 3 is provided with a barrel main body 3d having an open cylindrical upper end and a lid body 3e covering the barrel main body 3d, and is sealed with an O-ring (not illustrated). The powder 7 is put into the barrel 3 from an opening of the barrel main body 3d. Further, instead of having the barrel main body 3d and the lid body 3e, the barrel 3 may have a vertically or laterally divided division structure, and the powder 7 is put at the time of division in this case.

The barrel 3 also serves as a vacuum container. The exhaust means 4 for evacuation evacuates gas in an inner space of the barrel 3. The exhaust means 4 is airtightly held by a vacuum seal type bearing 4a.

The sputtering device 2 installed in the barrel 3 is connected to the sputtering power supply 1 installed outside the barrel 3. The sputtering power supply 1 may be either a direct current power supply or a high frequency power supply. The sputtering device 2 is charged in the barrel 3 by an arm 1b airtightly held by the vacuum seal type bearing 1a. A target cooling water passage inlet 1c, a target cooling water passage outlet 1d, and an argon gas inlet 1e are incorporated in the airtightly held arm 1b.

Two or more sputtering devices 2 are installed in the barrel 3 (in FIG. 2, three sputtering devices 2a, 2b, and 2c are installed), which allows two or more targets 6 to be installed in the barrel 3 (in FIG. 2, three targets 6a, 6b, and 6c are installed). The sputtering device 2 has one fixing portion 10 (10a, 10b, and 10c) for one target. That is, in FIG. 2, the three sputtering devices 2a, 2b, and 2c have the fixing portions 10a, 10b, and 10c, respectively. In addition, the sputtering power supply 1 is separately connected to each of the sputtering devices 2a, 2b, and 2c, and outputs are separately controlled. In this way, the sputtering device 2 serves as the multi-source sputtering device.

The fixing portion 10 is a backing plate for holding the target 6. The target 6 is attached to a front side of the backing plate by a mounting bracket. A shield cover serving as a counter electrode at the time of generating plasma is attached to the front side of the backing plate with a predetermined distance from the backing plate. Meanwhile, a plurality of recesses for accommodating magnets is formed on a back side of the backing plate. In addition, cooling water passages connected to the target cooling water passage inlet 1c and the target cooling water passage outlet 1d are disposed on the back side of the backing plate.

When the target 6 is attached to the fixing portion 10, the respective targets 6a, 6b, and 6c are disposed in parallel with one another at the same level position with respect to the direction of the main axis C as illustrated in FIG. 3. For example, it is preferable that positions of centers of gravity of the targets 6a, 6b, and 6c in the direction of the main axis C are aligned with each other. In addition, when sizes of the targets 6a, 6b, and 6c in the direction of the main axis C are identical to one another, it is preferable that positions of both ends of the respective targets in the direction of the main axis C are aligned with one another. Since the barrel 3 rotates around the main axis C, when the respective targets 6a, 6b, and 6c are disposed in parallel with one another at the same level position with respect to the direction of the main axis C, sputtered particles jumping out from the respective targets 6a, 6b, and 6c are uniformly hit by the powder put in the rotating barrel 3, and thus composition unevenness hardly occurs. In addition, lengths of the respective targets 6a, 6b, and 6c in the direction of the main axis C are preferably slightly shorter than an axial length of the barrel 3 to avoid interference.

When the targets are arranged in order along the direction of the main axis C without adopting arrangement of the targets illustrated in FIG. 3, since the powders are difficult to mix in the direction of the main axis C, only a sputtered particle jumping out from one target is hit, and composition unevenness occurs in the film. That is, since a plurality of types of sputtered particles jumping out from a plurality of targets do not reach a surface of a powder particle at the same time, it is not possible to form a uniform alloy film, double oxide film, double nitride film, or double carbide film. Even though the above-mentioned problem is solved if the respective targets are arranged in order along the direction of the main axis C and directions of target surfaces are adjusted such that the target particles jumping out from the respective targets are collected in a predetermined region, the region is limited to a part of a barrel side wall in the direction of the main axis C. Then, the amount of powder that can be processed per volume of the barrel becomes small, and thus productivity is inferior. Even when the same types of targets are used, productivity is similarly inferior.

Figure 4:
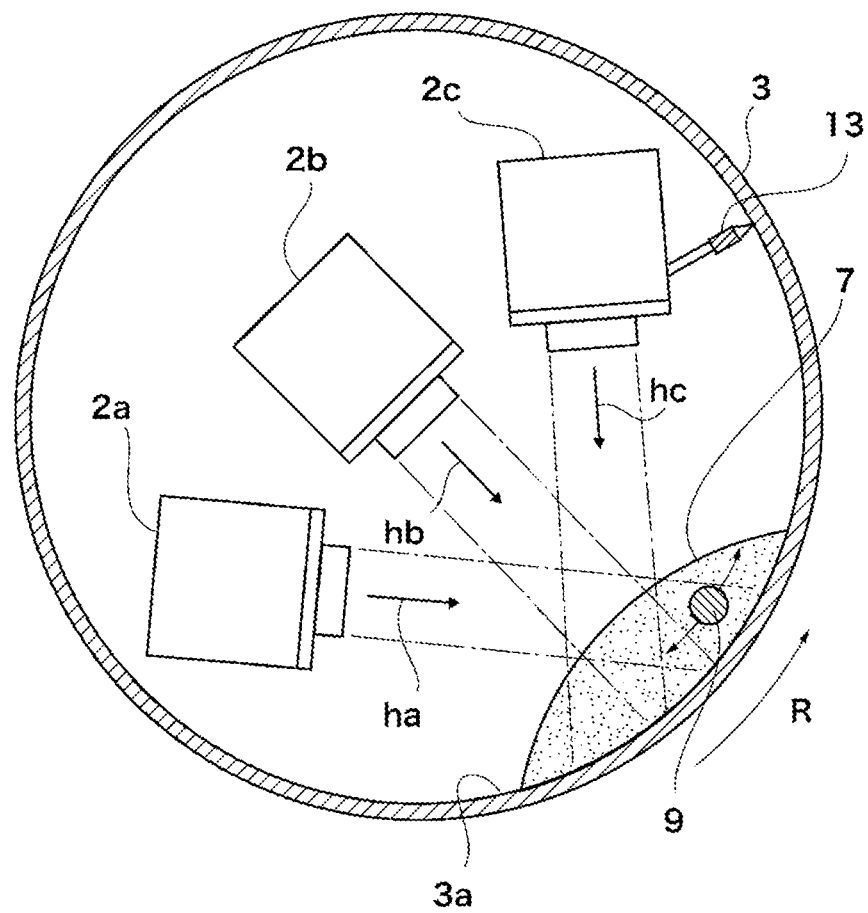
FIG. 4 is a schematic view for description of a relation between an orientation of a target and a position of powder.

Next, FIG. 4 will be referred. FIG. 4 is a schematic view for description of a relation between an orientation of a target and a position of powder. In the powder coating apparatus 100 according to the present embodiment, as illustrated in FIG. 4, when the target surfaces are projected toward an inner side wall 3a of the barrel 3 in parallel with normal lines ha, hb, and hc of the target surfaces, the respective targets 6a, 6b, and 6c are preferably directed in a direction in which projections overlap each other before reaching the inner side wall 3a. Since elements (sputtered particles) jumping out from the respective targets 6a, 6b, and 6c arrive in a state of being more mixed with the powder 7 put in the barrel 3, it is possible to form a thin film uniformly incorporating the respective elements from the respective targets on the surface of the powder particle. Specifically, a part before reaching the inner side wall 3a preferably refers to the surface of the powder 7, and refers to, for example, a range of 0.05 r to 0.15 r from the inner side wall 3a toward the main axis C when a radius of the barrel 3 (a distance between the main axis C and the inner side wall 3a) is set to r. In addition, the respective targets 6a, 6b, and 6c are more preferably directed such that the normal lines passing through the centers of gravity of the target surfaces overlap each other on the inner side wall 3a or on the surface of the particle of the powder 7. FIG. 3 illustrates a mode in which the normal lines (ha, hb, and hc) passing through the centers of gravity of the target surfaces are directed such that the normal lines overlap each other on the surface of the powder particle. Even when the sizes of the respective targets 6a, 6b, and 6c are not the same, the elements jumping out from the respective targets 6a, 6b, and 6c can mix more and reach the powder. Furthermore, it is preferable to set the sizes of the targets or the opening of the shield cover and the orientations of the targets such that the projections completely overlap each other on the inner side wall 3a or on the surface of the powder particle, and composition unevenness is further suppressed in this case.

In the powder coating apparatus 100 according to the present embodiment, it is preferable that the compositions of the respective targets 6a, 6b, and 6c are different from one another. It is possible to reduce composition unevenness at the time of forming an alloy film, a double oxide film, a double nitride film, a double carbide film, etc. As an alloy film, there is an example in which a Pt—Au alloy film is formed on a surface of a glass bead using a platinum target and a gold target. When the compositions of the targets 6a, 6b, and 6c are the same, the same effect as increasing a film formation amount within a predetermined time can be obtained. That is, a film formation rate can be increased. A combination of the compositions of the targets 6a, 6b, and 6c may be appropriately selected, and, for example, in the case of using an oxide target such as $SiO_2$ or $TiO_2$, a film formation rate is slow, and thus the film formation rate may be increased by sputtering two or three targets at the same time. For example, when three targets are used, the respective targets (6a, 6b, and 6c) are set to ($SiO_2$, $SiO_2$, and $SiO_2$), ($TiO_2$, $TiO_2$, and $TiO_2$), etc. In addition, when it is desired to form a composite film using a target (for example, metal) having a high film formation rate and a target (for example, oxide) having a low film formation rate, the number of targets having the low film formation rate is set to be more than the number of targets having the high film formation rate to relatively increase a speed of the target having the low film formation rate. For example, when three targets are used, two targets are set to have low film formation rates, and one target is set to have a high film formation rate. As an example, the respective targets (6a, 6b, and 6c) are set to (Pt, $SiO_2$, and $SiO_2$).

Figure 5:
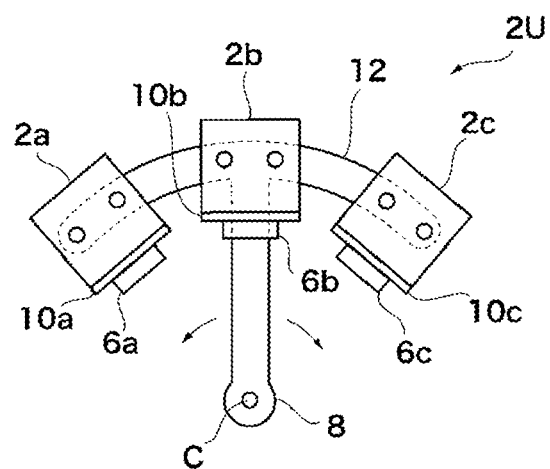
FIG. 5 is a schematic view for description of movement of a first angle adjustment mechanism of a target unit.

Next, FIG. 5 will be referred. FIG. 5 is a schematic view for description of movement of a first angle adjustment mechanism of a target unit. In the powder coating apparatus 100 according to the present embodiment, as illustrated in FIG. 5, it is preferable that the respective fixing portions 10a, 10b, and 10c are incorporated in a target unit 2U to fix a relative orientation relation of the respective mounted targets, the target unit 2U is attached to be rotatable around the main axis C, and a first angle adjustment mechanism 8 of the target unit 2U is further provided. Even though the powder 7 gradually rises when the barrel 3 is rotated, an angle of the target unit 2U can be adjusted in response to a degree of the gradual rise. For example, the target unit 2U corresponds to a mode in which the respective fixing portions 10a, 10b, and 10c are fixed by fixing the respective sputtering devices 2a, 2b, and 2c to one housing, or a mode in which the respective fixing portions 10a, 10b, and 10c are fixed by fixing the respective sputtering devices 2a, 2b, and 2c using an arm 12 as in FIG. 5. The first angle adjustment mechanism 8 adjusts angles of the respective targets 6a, 6b, and 6c attached to the respective fixing portions 10a, 10b, and 10c while keeping distances to the main axis C constant. A relative positional relation between each of the targets 6a, 6b, and 6c and the powder 7 can be kept constant by the first angle adjustment mechanism 8 even when the powder 7 gradually rises due to rotation of the barrel 3.

Figure 6:
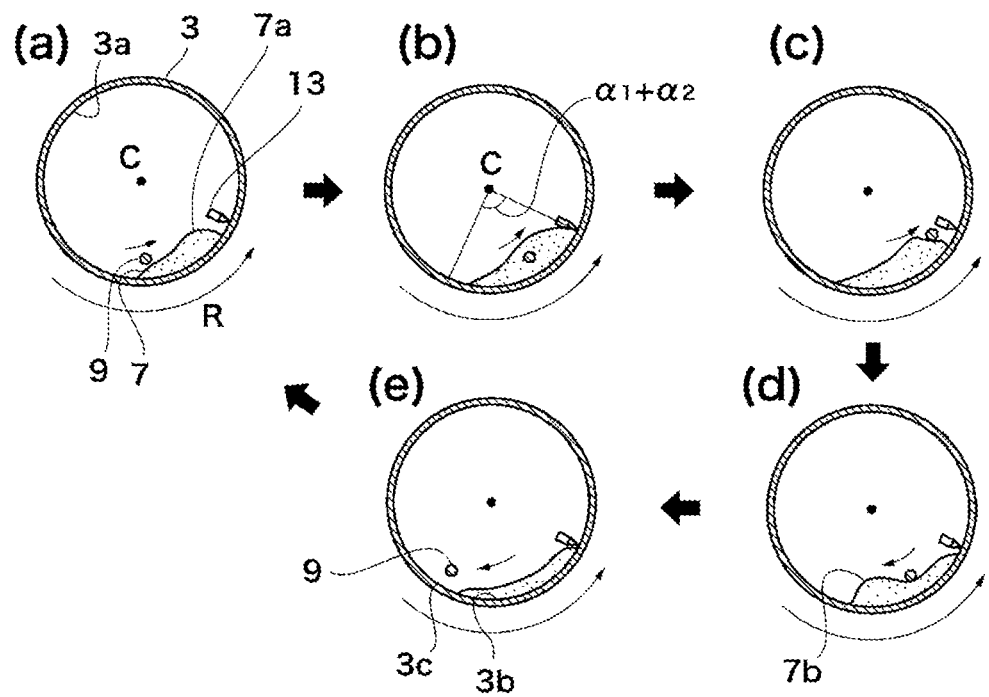
FIG. 6 is a schematic view for description of an movement of stirring and leveling the powder in the powder coating apparatus according to the present embodiment. The leveling component moves in the order of (a), (b), (c), (d) and (e) in chronological order, returns to (a), and this movement is repeated.

Next, FIGS. 1 and 6 will be referred. FIG. 6 is a schematic view for description of an movement of stirring and leveling the powders in the powder coating apparatus according to the present embodiment. The leveling component moves in the order of (a), (b), (c), (d) and (e) in chronological order, returns to (a), and this movement is repeated. In the powder coating apparatus 100 according to the present embodiment, as illustrated in FIGS. 1 and 6, it is preferable to further include a powder rising suppression component 13 disposed in contact with a side wall of a part of the inner side wall 3a of the barrel 3 which moves upward by the rotation of the barrel 3 to determine an upper limit position to which the powder 7 gradually rises, and a leveling component 9 for the powder 7 disposed at an interval from the inner side wall 3a of the barrel 3 at a position lower than the powder rising suppression component 13 to perform swinging motion about the main axis C as a rotation center. The side wall of the part of the inner side wall 3a of the barrel 3 which moves upward by the rotation of the barrel 3 refers to a right half part of a circle formed by the side wall of the barrel 3 as described with reference to FIG. 6(a). FIG. 6 illustrates a case in which the leveling component 9 corresponds to a round bar type having a circular cross section.

The powder rising suppression component 13 preferably corresponds to a brush or a spatula. The brush or spatula can efficiently scrape off the powder 7 from the barrel 3. For example, the powder rising suppression component 13 is fixed to a part supporting the sputtering device 2 of FIG. 1. By adopting such a structure, it is possible to simplify a mounting structure of the powder rising suppression component. A part modularized with the sputtering device (a part fixed to and integrated with the sputtering device) may serve as the part supporting the sputtering device 2. It is preferable that the part supporting the sputtering device 2 corresponds to a position at which a countermeasure for grounding is taken. For example, the part modularized with the sputtering device corresponds to the arm 12 of the target unit 2U illustrated in FIG. 5. When the respective sputtering devices 2a, 2b, and 2c are fixed to the one housing, the part modularized with the sputtering device corresponds to the housing. In addition, instead of being fixed to the part supporting the sputtering device 2, the powder rising suppression component 13 may be fixed by being connected to a portion of the sputtering device corresponding to neither the target nor a part electrically connected to the target, for example, to a position at which a countermeasure for grounding is taken such as the housing of the sputtering device main body. In FIG. 2, the powder rising suppression component 13 may be fixed by being connected to the sputtering device 2c, in particular, the portion corresponding to neither the target nor the part electrically connected to the target. By adopting such a structure, it is possible to simplify the mounting structure of the powder rising suppression component. The powder rising suppression component 13 may include a support bar. When the support bar is provided, one end of the support bar is connected to a main body of the powder rising suppression component 13, and the other end of the support bar is connected to the portion of the sputtering device corresponding to neither the target nor the part electrically connected to the target or the part modularized with the sputtering device. In this instance, it is preferable that a length and a shape of the support bar are determined such that the support bar does not pass through a space between the target surface and an inner wall surface of the barrel. By fixing the powder rising suppression component 13 to a part which does not move together with the barrel 3 even when the barrel 3 rotates, the powder rising suppression component 13 may suppress the powder 7 from rotating similarly to the barrel 3 by rotation of the barrel 3. In addition, since the position of the powder rising suppression component 13 is fixed during at least the film formation, the position is the upper limit position to which the powder 7 gradually rises. When the position of the powder rising suppression component 13 is matched with a boundary position of an irradiation region of the sputtered particle, the sputtered particle can be more efficiently irradiated to the powder 7. That is, since the sputtered particle can be hit while gradual rising of the powder 7 is retained by the powder rising suppression component 13, irradiation efficiency of the sputtered particle can be increased.

The leveling component 9 preferably corresponds to a bar or a plate. When the leveling component 9 corresponds to the bar, there is a form in which a cross-sectional shape corresponds to a circle, a semicircle, an ellipse, a semi-ellipse, or a polygon such as a triangle/quadrangle. In addition, when the leveling component 9 corresponds to the plate, there is a form in which a cross-sectional shape corresponds to a rectangle having a long side and a short side. The bar or plate may easily level a pile 7b of the powder 7. The leveling component 9 is fixed to a rotation axis of the stirring motor 9b airtightly held by the vacuum seal type bearing 9a illustrated in FIG. 1, and swings within a range of an angle ($\alpha_1+\alpha_2$) illustrated in FIG. 6(b) around the rotation axis. This rotation axis is coaxial with the main axis C which is a rotation axis of the barrel 3. Further, in the present embodiment, it is preferable that a range of an angle θ includes an existence range of the powder 7 at the time of barrel rotation. A swinging angle and a swinging speed may be appropriately adjusted according to an aggregation state of the powder 7, and it is necessary to set the swinging speed to a speed at which powder does not swirl due to an excessively high swinging speed. For example, the swinging speed is set to 2 reciprocations/minute, and may be in a range of 1 to 10 reciprocations/minute. The leveling component 9 may be intermittently swung.

When the leveling component 9 performs swinging motion along a rotation direction R of the barrel 3 (for example, see FIGS. 6(a) to 6(c)), the leveling component 9 preferably turns back below the powder rising suppression component 13. It is preferable to set a position between a mountain peak of a pile 7a of the powder 7 and the powder rising suppression component 13 to a turning point. For example, it is more preferable to set a position at which the leveling component 9 comes into contact with the powder rising suppression component 13 to the turning point or set a position within 20 mm below the powder rising suppression component 13 to the turning point. When the leveling component 9 performs swinging motion in an opposite direction to the rotation direction R of the barrel 3, the whole powder 7 may be uniformly leveled. In addition, stirring efficiency of the leveling component 9 increases when compared to a case in which the powder rising suppression component 13 merely scrapes off powder adhering to the inner wall of the barrel.

When the leveling component 9 performs swinging motion in the opposite direction to the rotation direction R of the barrel 3 (for example, see FIGS. 6(d) and 6(e)), the leveling component 9 preferably turns back at a position 3c beyond the lowest position 3b on the inner side wall 3a of the barrel 3 (for example, see FIGS. 6(e) to 6(a)). When the leveling component 9 performs swinging motion in the rotation direction of the barrel 3, the whole powder 7 may be agitated. The position 3c beyond the lowest position 3b preferably corresponds to a position beyond a boundary portion at which the powder 7 is present. For example, a vertical direction may be set to 0°, and a position of 1° to 45° in the opposite direction to the rotation direction R may be set to the turning point.

A description will be given of a relation between the swinging motion of the leveling component 9 and movement of the powder 7. First, the powder 7 moves to gradually rise in the rotation direction R by rotation of the barrel 3. In this instance, the powder 7 gradually rises while creating the pile 7a. Here, the leveling component 9 enters the pile 7a of the powder 7 (see FIG. 6(b)) when performing swinging motion along the rotation direction R of the barrel 3 (for example, see FIGS. 6(a) to 6(c)), and comes out of the pile 7a (see FIG. 6(c)) when moving up to a front of the powder rising suppression component 13. As a result, the powder 7 is agitated including an inside thereof. Subsequently, the leveling component 9 moves while leveling the pile 7b of the powder 7 (see FIG. 6(d)) when the leveling component 9 is inverted to perform swinging motion in the opposite direction to the rotation direction R of the barrel 3 (for example, see FIGS. 6(d) and 6(e)), and the surface of the powder 7 is flatly leveled upon arriving at the turning point of the leveling component 9 (see FIG. 6(e)). As a result, the sputtered particle is likely to uniformly hit the whole powder 7, and composition unevenness of the film may be suppressed particularly in the case of multi-source sputtering. Flattening of the surface of the powder 7 refers to leveling of the surface along a shape of an inner surface of the side wall of the barrel.

Figure 7:
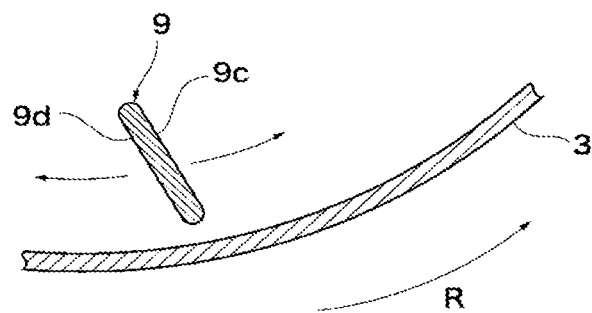
Figure 7:
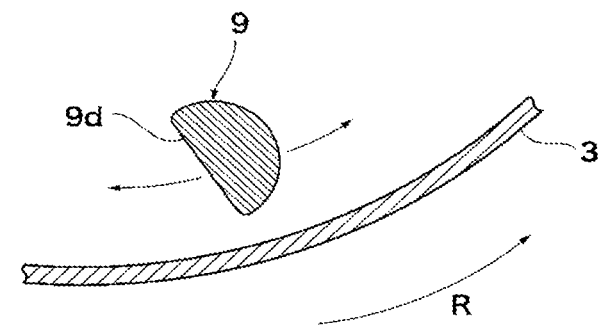
Figure 7:
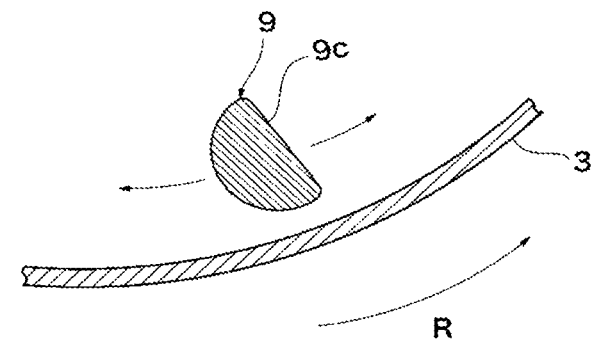
Figure 8:
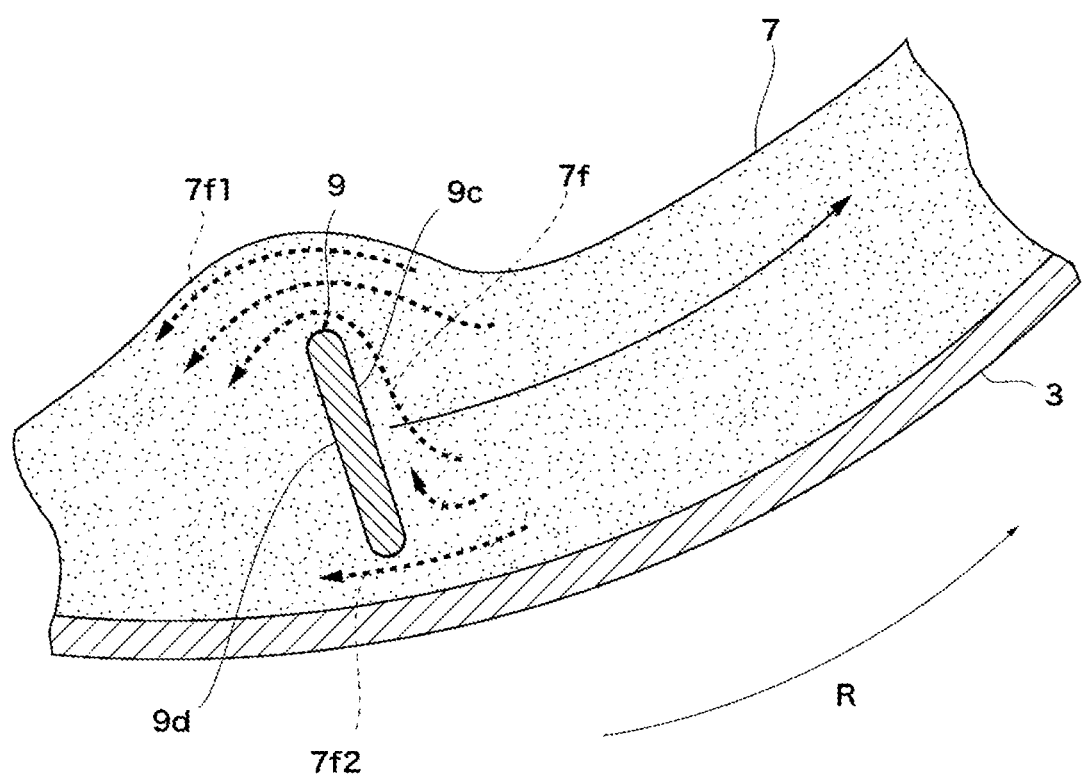
FIG. 8 is a schematic view for description of movement of the powder when the leveling component moves in a rotation direction R of the barrel.
Figure 9:
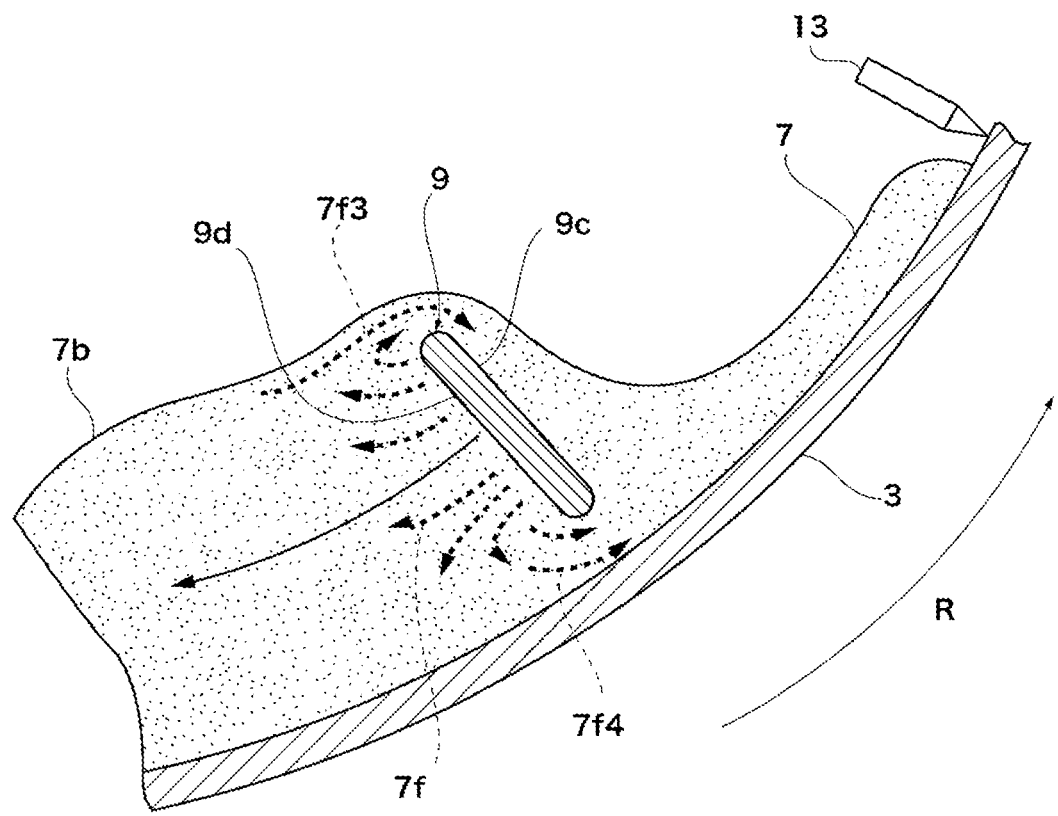
FIG. 9 is a schematic view for description of movement of the powder when the leveling component moves in an opposite direction to the rotation direction R of the barrel.

Further, a more detailed description will be given of a mode of agitating the powder 7 using the leveling component 9 and a mode of leveling the powder 7 with reference to FIGS. 7 to 9. FIG. 7 is a schematic view illustrating another example of the cross-sectional shape of the leveling component, FIG. 7(a) illustrates an example in which the leveling component has a plate shape, FIG. 7(b) illustrates a first example of a case in which the leveling component has a semicircular cross section, and FIG. 7(c) illustrates a second example of the case in which the leveling component has a semicircular cross section. FIG. 8 is a schematic view for description of movement of the powder when the leveling component moves in the rotation direction R of the barrel. In FIG. 8, a solid arrow extending from the leveling component 9 as a start point indicates a direction in which the leveling component 9 moves (the same direction as the direction R). FIG. 9 is a schematic view for description of movement of the powder when the leveling component moves in the opposite direction to the rotation direction R of the barrel. In FIG. 9, a solid arrow extending from the leveling component 9 as a start point indicates a direction in which the leveling component 9 moves (the opposite direction to the direction R). As illustrated in FIGS. 7(a) and 7(c), the leveling component 9 has a first surface 9c directed in the rotation direction R of the barrel 3. The first surface 9c is preferably inclined in the opposite direction to the rotation direction R toward the main axis C (not illustrated in FIG. 7, see FIG. 6). That is, the surface is preferably inclined to scoop up the powder 7 at the time of approaching the powder rising suppression component 13. As illustrated in FIG. 8, when the leveling component 9 moves in the rotation direction R, the powder 7 is scooped up using the first surface 9c. In other words, the powder 7 above a lower end of the first surface 9c passes over the leveling component 9 to form a flow 7f1 of the powder 7. Meanwhile, the powder 7 below the lower end of the first surface 9c passes under the leveling component 9 to form a flow 7f2 of the powder 7. In this way, when the leveling component 9 has the first surface 9c, stirring efficiency of the powder 7 can be further enhanced. It is preferable that the first surface 9c has irregularities, and the powder 7 is more likely to mix when the powder 7 is scooped up using the first surface 9c. When the leveling component 9 illustrated in FIG. 7(b) moves in the rotation direction R, the powder 7 hitting the leveling component 9 forms powder flows by being separated into upper and lower parts, and thus the powder is agitated.

Subsequently, as illustrated in FIGS. 7(a) and 7(b), the leveling component 9 has a second surface 9d directed in the opposite direction to the rotation direction R of the barrel 3. The second surface 9d is inclined with respect to a radial direction of the barrel, and more specifically, is preferably inclined in the opposite direction to the rotation direction R toward the main axis C (not illustrated in FIG. 7, see FIG.

6 with regard to a position of the axis C). That is, the surface is preferably inclined to push and level the powder 7 at the time of moving away from the powder rising suppression component 13. As illustrated in FIG. 9, when the leveling component 9 moves in the opposite direction to the rotation direction R, the powder 7 is pushed down using the second surface 9d. That is, the powder 7 located below an upper end of the second surface 9d is moved in the opposite direction to the rotation direction R, easily passes below the leveling component 9, and forms a flow 7f4 of the powder 7. Meanwhile, the powder 7 above the upper end of the second surface 9d passes above the leveling component 9, and forms a flow 7f3 of the powder 7. When the amount of the powder 7 is reduced, the flow 7f3 of the powder 7 is not found. Further, after the powder 7 passes through the leveling component 9, the surface thereof is leveled. In this way, when the leveling component 9 has the second surface 9d, the surface of the powder 7 can be leveled using the second surface 9d when the leveling component 9 moves in the opposite direction to the rotation direction R. The second surface 9d preferably has a smooth surface, and the powder 7 can be smoothly pushed down using the second surface 9d. When the leveling component 9 illustrated in FIG. 7(c) moves in the opposite direction to the rotation direction R, the powder 7 hitting the leveling component 9 forms powder flows by being separated into upper and lower parts, and thus the powder 7 may be deeply leveled when compared to the case of using the leveling component 9 illustrated in FIGS. 7(a) and 7(b).

When the leveling component 9 is in a shape of a square bar or a plate, a corner may cause abnormal discharge, and thus the corner is preferable to rounded off.

The speed of the swinging motion of the leveling component 9 at the time of moving the leveling component 9 along the rotation direction R of the barrel 3 is preferably the same as the speed at the time of moving the leveling component 9 in the opposite direction. In addition, the speed of the swinging motion of the leveling component 9 may be different between a case in which the leveling component 9 is moved along the rotation direction R and a case in which the leveling component 9 is moved in the opposite direction.

Figure 10:
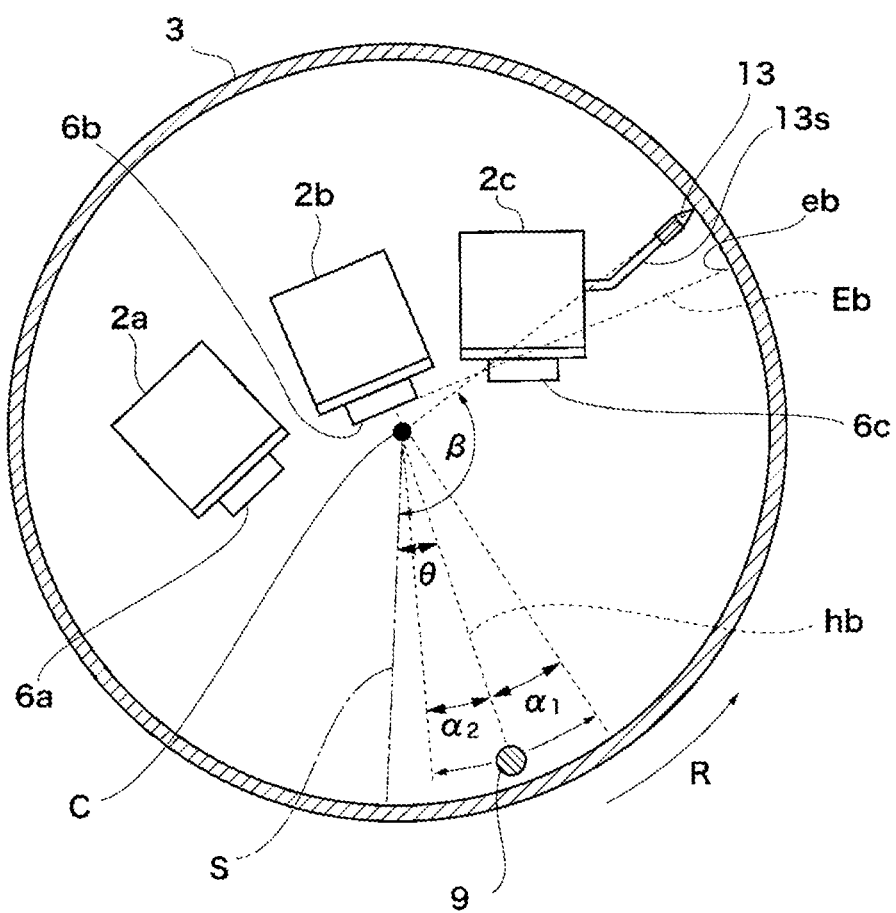
FIG. 10 is a schematic cross-sectional view for description of a positional relation of each of the powder rising suppression component, the leveling component, and the target, and illustrates a mode in which an odd number of (specifically three) targets are provided.

Next, a more detailed description will be given of a positional relation of each of the powder rising suppression component, the leveling component, and the target with reference to FIG. 10. FIG. 10 is a schematic cross-sectional view for description of the positional relation of each of the powder rising suppression component, the leveling component, and the target, and illustrates a mode in which an odd number of (specifically three) targets are provided. Here, on a cross section vertically traversing the main axis C and passing through the powder rising suppression component 13, the leveling component 9, and the targets 6a, 6b, and 6c, a position of each of the powder rising suppression component 13, the leveling component 9, and the targets 6a, 6b, and 6c will be represented on polar coordinates. The position of the main axis C is set to an origin O of the polar coordinates, a vertical downward line passing through the main axis C is set to a start line S of an angle 0°, and the rotation direction R of the barrel 3 is set to a direction forming a positive angle with respect to the start line. An angle at which the powder rising suppression component 13 is fixed is set to β. A radius vector in the polar coordinates of the powder rising suppression component 13 corresponds to a distance from the origin O to the powder rising suppression component 13 when the powder rising suppression component 13 is disposed in a contact state on a side wall of a part of the inner side wall of the barrel 3 moving upward by rotation of the barrel 3.

When an odd number (however, excluding 1) of targets are provided on the cross section as illustrated in FIG. 10, an angle 1 of a line corresponding to the normal line hb of the target surface of the target 6b located at a center or an extension line thereof and intersecting the main axis C is set to θ. In the case of FIG. 10, the target located at the center corresponds to the target 6b. With respect to the line hb having the angle θ, a maximum angle of a swing width of swinging of the leveling component 9 is set to $\alpha_1$ in a positive direction and to $\alpha_2$ in a negative direction. In this instance, the angle β, the angle θ, the angle $\alpha_1$, and the angle $\alpha_2$ preferably satisfy Formula 1, Formula 2, Formula 3, and Formula 4. It is preferable that the targets 6a and 6c other than the target 6b located at the center are disposed in a relation of line symmetry with respect to the line hb.

$$0° < \beta - (\theta + \alpha_1) < 45° \quad \text{(Formula 1)}$$

$$90° \leq \beta < 135° \quad \text{(Formula 2)}$$

$$0° \leq \theta \leq 45° \quad \text{(Formula 3)}$$

$$0° < \alpha_2 < 60° \quad \text{(Formula 4)}.$$

In the case of the mode illustrated in FIG. 10, θ corresponding to the angle 1 of the normal line hb satisfies Formula 3. In other words, the target surface of the target 6b is directed vertically downward or inclined in the direction of the rotation direction R of the barrel 3. It is preferable that the target surface of the target 6a and the target surface of the target 6b are directed in directions approaching the line hb as the normal lines thereof approach the inner wall surface of the barrel 3. The sputtered particles jumping out from the target surfaces of the targets 6a, 6b, and 6c are mixed and readily arrive at the powder (not illustrated). When the barrel 3 rotates, the powder (not illustrated) is gradually raised to the rotation direction R side. Therefore, it is preferable to set θ using the first angle adjustment mechanism such that the target surface faces the front with respect to the raised powder. When θ is less than 0°, that is, a negative angle, there is concern that the sputtered particles may not efficiently hit the gradually raised powder. When θ exceeds 45°, there is concern about excessive inclination with respect to gradual rise of the powder, and there is concern that the sputtered particles may not efficiently hit the powder. θ is preferably 10° or more and more preferably 15° or more. In addition, θ is preferably 35° or less and more preferably 30° or less.

The angle β at which the powder rising suppression component 13 is fixed satisfies Formula 2. When β is less than 90°, the sputtered particles are more likely to hit the powder rising suppression component 13, and there is concern that an impurity may easily enter the powder. When β is 135° or more, there is concern that the powders may fly up when the powders are separated from the barrel 3. β is preferably 92° or more and more preferably 95° or more. In addition, β is preferably 110° or less and more preferably 105° or less.

Each of $\alpha_1$ and $\alpha_2$ is preferably set such that the whole of the gradually raised powder is leveled by swinging of the leveling component 9. $\alpha_2$ may or may not be equal to $\alpha_1$, and is set to less than 60° such that the leveling component 9 levels the gradually raised powder including a lowermost end thereof or up to the vicinity of the lowermost end. $\alpha_1$ is determined to satisfy Formula 1 after taking the set angles of θ and β into consideration. According to Formula 1, an upper limit of swinging of the leveling component 9 in the direction R is lower than the powder rising suppression component 13 [{β−(θ+α$_1$)}>0°]. {β−(θ+α$_1$)}=0° is satisfied when the leveling component 9 swings until the leveling component 9 comes into contact with the powder rising suppression component 13. Meanwhile, according to Formula 1, a lower limit of swinging of the leveling component 9 in the direction R is lower than the powder rising suppression component 13 and set to a position at which {β−(θ+α$_1$)} is smaller than 45°. When {β−(θ+α$_1$)} is 45° or more, the powder rising suppression component 13 is located above and away from a region in which the powder is leveled by the leveling component 9, and thus the powder rising suppression component 13 only performs a function of scraping off the powder adhering to the barrel 3. Further, since the powder rising suppression component 13 is away from the region in which the powder is leveled by the leveling component 9, the inner wall surface of the barrel 3 may be exposed, and there is concern that the sputtered particles may arrive at the inner wall surface of the barrel 3 to form a film in this case. {β−(θ+α$_1$)} is preferably 5° or more and more preferably 15° or more. In addition, {β−(θ+α$_1$)} is preferably 40° or less and more preferably 30° or less.

Figure 11:
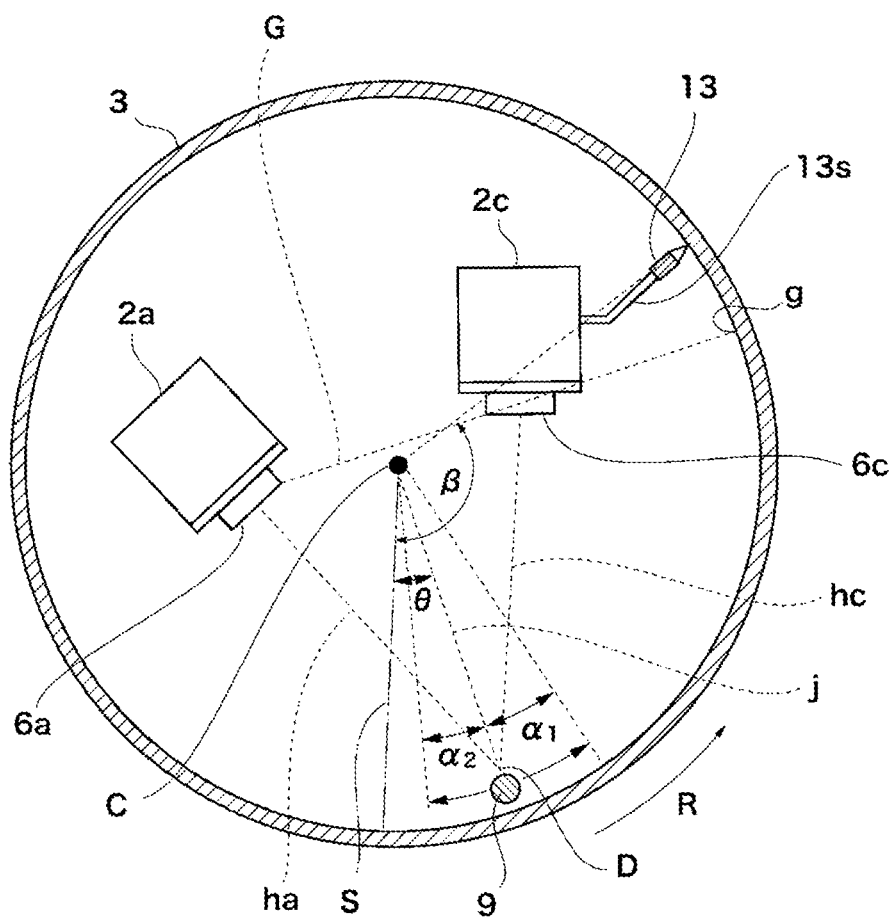
FIG. 11 is a schematic cross-sectional view for description of a positional relation of each of the powder rising suppression component, the leveling component, and the target, and illustrates a mode in which an even number of (specifically two) targets are provided.

Next, a description will be given of another mode of the positional relation of each of the powder rising suppression component, the leveling component, and the target with reference to FIG. 11. FIG. 11 is a schematic cross-sectional view for description of the positional relation of each of the powder rising suppression component, the leveling component, and the target, and illustrates a mode in which an even number of (specifically two) targets are provided. The above positional relation is represented using polar coordinates similarly to the case of FIG. 10.

When an even number of targets are provided on a cross section as illustrated in FIG. 11, an angle 2 of a line connecting the main axis C and a point D at which the normal lines ha and hc of the target surfaces of two targets 6a and 6c located at a center or extension lines thereof intersect each other is set to θ. In the case of FIG. 11, the two targets located at the center correspond to the targets 6a and 6c. For example, when the number of targets is four (not illustrated), two targets interposed by targets at both ends correspond to the two targets located at the center. With respect to a line j connecting C and D and having the angle θ, a maximum angle of a swing width of swinging of the leveling component 9 is set to α$_1$ in a positive direction and to α$_2$ in a negative direction. In this instance, the angle β, the angle θ, the angle α$_1$, and the angle α$_2$ preferably satisfy Formula 1, Formula 2, Formula 3, and Formula 4. It is preferable that the targets 6a and 6c are disposed in a relation of line symmetry with respect to the line j.

In the case of the mode illustrated in FIG. 11, θ corresponding to the angle 2 of the line j satisfies Formula 3. That is, the target surfaces of the targets 6a and 6c are directed to the point D, and the point D is located vertically below a point C or disposed at a position shifted to a direction side in the rotation direction R of the barrel 3. The sputtered particles jumping out from the target surfaces of the targets 6a and 6c are mixed and readily arrive at the powder (not illustrated). When the number of targets is an even number of four or more, normal lines of the target surfaces thereof are preferably directed in directions of approaching the line j toward the inner wall surface of the barrel 3. A relation of θ; α$_1$ and α$_2$; β; and {β−(θ+α$_1$)} in FIG. 11 is preferably the same as the relation thereof described with reference to FIG. 10.

Next, a more detailed description will be given of a mode of having the first angle adjustment mechanism 8. First, a description will be given of a mode (referred to as mode A) in which an odd number of (specifically three) targets are present with reference to FIG. 10. The powder coating apparatus according to the present embodiment has the first angle adjustment mechanism (indicated by reference numeral 8 of FIGS. 1 and 5 and not illustrated in FIG. 10) capable of changing the inclination θ of the target 6 and fixing the inclination at any angle within the angle range of Formula 3, and the powder rising suppression component 13 is preferably fixed to the portion of the sputtering device 2c (which may be 2a or 2b) corresponding to neither the target nor the part electrically connected to the target or the part modularized with the sputtering device 2. In FIG. 10, the powder rising suppression component 13 is connected to a portion of the sputtering device 2c, which is closest to a side wall of a part moving upward by rotation of the barrel 3 on the inner side wall of the barrel 3, corresponding to neither the target nor the part electrically connected to the target through a support bar 13s. When the sputtering device 2c is fixed to the arm 12 as illustrated in FIG. 5, and the arm 12 is modularized with the sputtering device 2c, the powder rising suppression component 13 may be connected to the arm 12 through the support bar 13s. When the targets 6a, 6b, and 6c are inclined and fixed by the first angle adjustment mechanism 8, a position of the powder rising suppression component 13 may be moved in conjunction therewith by the same angle as an angle of the inclination. Such a simple mechanism allows a constant positional relation between the target surfaces and the powder rising suppression component 13 irrespective of inclinations of the targets 6a, 6b, and 6c.

Referring to FIG. 11, in a mode (referred to as mode B) in which an even number of (specifically two) targets are present, when the targets 6a and 6c are inclined and fixed using the first angle adjustment mechanism 8 by connecting the support bar 13s to a portion of the sputtering device 2c, which is closest to a side wall of a part moving upward by rotation of the barrel 3 on the inner side wall of the barrel 3, corresponding to neither the target nor the part electrically connected to the target, a position of the powder rising suppression component 13 may be moved in conjunction therewith by the same angle as an angle of the inclination. Alternatively, the support bar 13s may be connected to a portion of the sputtering device 2a corresponding to neither the target nor a part electrically connected to the target. The support bar 13s may be connected to the arm 12 illustrated in FIG. 5.

Next, a description will be given of a preferable positional relation between the target surface and the powder rising suppression component in mode A and mode B. In mode A illustrated in FIG. 10, the powder rising suppression component 13 is preferably fixed to the portion of the sputtering device 2c corresponding to neither the target nor the part electrically connected to the target or a part modularized with the sputtering device 2c while being disposed above an intersecting part eb between a line Eb extending the target surface of the target 6b located at the center and the inner side wall of the barrel 3. Further, in mode B illustrated in FIG. 11, the powder rising suppression component 13 is preferably fixed to the portion of the sputtering device 2c corresponding to neither the target nor the part electrically connected to the target or the part modularized with the sputtering device 2c while being disposed above an intersecting part g between a line G connecting both ends of the target surfaces of the two targets 6a and 6c located at the center facing each other and the inner side wall of the barrel 3. Since the powder rising suppression component 13 is disposed above the target surface, contamination due to accumulation of sputtered particles can be suppressed.

Next, a description will be given of a mode of further including a second angle adjustment mechanism capable of fixing the powder rising suppression component 13 at a variable position in addition to the first angle adjustment mechanism 8. Even though mode A and mode B illustrated in FIGS. 10 and 11 adopt a mode in which the support bar 13s supporting the powder rising suppression component 13 is connected to the portion of the sputtering device corresponding to neither the target nor the part electrically connected to the target, it is possible to adopt a modified mode (not illustrated) of being connected to the second angle adjustment mechanism which rotates with respect to the main axis C independently of the first angle adjustment mechanism 8 and in which a rotation angle may be fixed instead of such a mode. Alternatively, it is possible to adopt a modified mode (not illustrated) in which a movable stand is provided in the portion of the sputtering device corresponding to neither the target nor the part electrically connected to the target or the part modularized with the sputtering device, and the support bar 13s supporting the powder rising suppression component 13 is connected to the stand. The powder rising suppression component 13 may be fixed to the same position as that in mode A and mode B using the second angle adjustment mechanism. It is possible to adjust a fixing position of the powder rising suppression component 13 independently of the inclination of the target and to suppress the powder rising suppression component from being contaminated by sputtering.

Next, a description will be given of a mode in which the first angle adjustment mechanism 8 is included and the position of the powder rising suppression component 13 is fixed without the powder rising suppression component 13 being affected by rotation of the barrel 3 and being affected by the inclination of the sputtering device. This mode is a modified mode (not illustrated) of connecting the support bar 13s supporting the powder rising suppression component 13 to, for example, a portion of the vacuum seal type bearing of FIG. 1 not interfering with rotation of the barrel 3 and swinging motion of the leveling component 9 instead of connecting the support bar 13s to the portion of the sputtering device corresponding to neither the target nor the part electrically connected to the target in mode A and mode B illustrated in FIGS. 10 and 11. The powder rising suppression component 13 may be fixed to the same position after having an inclination of $\theta_{MAX}$ in mode A and mode B. The first angle adjustment mechanism 8 may be fixed such that a position thereof is variable in a range of including or partially overlapping the target by 0° or more and $\theta_{MAX}$ or less (where, $\theta_{MAX}$ satisfies Formula 5). In this modified mode, it is possible to suppress the powder rising suppression component 13 from being contaminated by sputtering regardless of the inclination of the target.

$$0° < \theta_{MAX} \leq 45°$$ (Formula 5)

(Modification 1)

The barrel 3 may be put in a vacuum chamber (not illustrated). In this case, the barrel 3 may not be sealed, and thus a structure of the barrel may be simplified.

EXAMPLES

Hereinafter, even though the present disclosure will be described in more detail with reference to examples, the present disclosure is not interpreted as being limited to the examples.

Example 1

Powder obtained by forming a Pt—Au alloy thin film on a surface of a glass bead is produced using the powder coating apparatus illustrated in FIG. 1. First, one Pt target (purity 99.9%, target surface 150×35 mm) was prepared and attached to the fixing portion 10a. In addition, one Au target (purity 99.99%, target surface 150×35 mm) was prepared and attached to the fixing portion 10c. The fixing portion 10b was blank without a target attached. The sputtering power supply 1 was set to a high frequency power supply (frequency 13.56 MHz). Subsequently, after the inside of the barrel 3 was evacuated up to $3 \times 10^{-3}$ Pa or less while powder was not put therein, argon gas was allowed to flow to perform adjustment such that a pressure of 0.4 Pa was maintained, sputtering was carried out, and rates of the Pt target and the Au target corresponding to an output of the high frequency power supply were confirmed. Then, 150 g of glass beads having a diameter of 1 mm were put into the barrel 3, evacuation was carried out up to $1.3 \times 10^{-3}$ Pa, and then argon gas was allowed to flow to perform adjustment such that a pressure of 0.4 Pa was maintained. Thereafter, an output of 200 W was applied to the Pt target, an output of 100 W was applied to the Au target, the barrel 3 was rotated, and a film was formed on a surface of the glass bead while swinging the leveling component 9 (round bar type). The output of the high frequency power supply was calculated and obtained from the sputtering rates confirmed above to be Pt −50 wt % Au. A film formation time was set to 30 minutes. Analysis of the glass bead taken out after the film formation confirmed that a Pt −48 wt % Au alloy thin film was formed on the surface. A composition of the thin film was obtained using an ICP emission spectrophotometer (SPECTRO-CIROS manufactured by Rigaku Corporation).

Example 2

Powder obtained by forming a two-layer film of a Ti thin film (lower layer) and an Au thin film (upper layer) on a surface of a glass bead is produced using the powder coating apparatus illustrated in FIG. 1. First, one Ti target (purity 99.9%, target surface 150×35 mm) was prepared and attached to the fixing portion 10b. In addition, one Au target (purity 99.99%, target surface 150×35 mm) was prepared and attached to the fixing portion 10c. The fixing portion 10a was blank without a target attached. The sputtering power supply 1 was set to a high frequency power supply (frequency 13.56 MHz). Subsequently, after sputtering was performed and the inside of the barrel 3 was evacuated up to $3 \times 10^{-3}$ Pa or less while powder was not put therein, argon gas was allowed to flow to perform adjustment such that a pressure of 0.4 Pa was maintained, and rates of the Ti target and the Au target corresponding to an output of the high frequency power supply were confirmed. Then, 150 g of glass beads having a diameter of 1 mm were put into the barrel 3, evacuation was carried out up to $2.1 \times 10^{-3}$ Pa, and then argon gas was allowed to flow to perform adjustment such that a pressure of 0.4 Pa was maintained. Thereafter, first, 200 W was applied only to the Ti target, the barrel 3 was rotated, and sputtering was performed for 30 minutes while swinging the leveling component 9 (round bar type), thereby forming a Ti film on the surface of the glass bead. Subsequently, 200 W was applied only to the Au target, the barrel 3 was rotated, and sputtering was performed for 1 hour while swinging the leveling component 9 (round bar type), thereby further forming an Au film on a surface of the Ti film. As a result, a glass bead on which two layers of Ti (lower layer)/Au (upper layer) are formed was obtained without opening the barrel 3 to the atmosphere in the meantime. This thin film had excellent adhesion. Adhesion is poor when the Au film is directly formed on the glass bead. Therefore, film formation was performed using the Ti film as an intermediate layer for improving adhesion.

EXPLANATION OF SIGN

1: sputtering power supply
1a: vacuum seal type bearing
1b: arm
1c: target cooling water passage inlet
1d: target cooling water passage outlet
1e: argon gas inlet
2: sputtering device
3: barrel
3a: inner side wall of barrel
3b: lowest position of barrel
3c: position beyond lowest position of barrel
3d: barrel main body
3e: lid body
4: exhaust means
4a: vacuum seal type bearing
5: drive motor
5a: driving roll
5b: driven roll
6, 6a, 6b, 6c: target
7: powder
7a, 7b: pile of powder
7f1, 7f2, 7f3, 7f4: powder flow
8: first angle adjustment mechanism
9: leveling component
9a: vacuum seal type bearing
9b: stirring motor
9c: first surface
9d: second surface
10, 10a, 10b, 10c: fixing portion
12: arm
13: powder rising suppression component
13s: support bar
ha, hb, hc: normal line of target surface
2U: target unit
100: powder coating apparatus
R: rotation direction of barrel
C: main axis
D: point at which normal lines of target surfaces intersect each other
G: line connecting both ends of two target surfaces located at center facing each other
S: start line
g: intersecting part between line G and inner side wall of barrel
j: line connecting D and C
E, Eb: line extending target surface
e: intersecting part between line E and inner side wall of barrel
eb: intersecting part between line Eb and inner side wall of barrel

What is claimed is:

1. A powder coating apparatus comprising:
a barrel;
exhaust means which evacuates an inside of the barrel; and
two or more sputtering devices installed inside the barrel,
the barrel having a main axis directed in a horizontal direction and rotating around the main axis, the two or more sputtering devices forming a coating film on a surface of powder put in the barrel,
wherein each of the two or more sputtering devices has one fixing portion for one target so that two or more targets are mountable in the powder coating apparatus,
respective targets are disposed along a length in parallel to each other and the length coincides with a direction of the main axis when the target is mounted on the fixing portion, and
when target surfaces of the respective target are projected normal to the respective target surfaces toward an inner side wall of the barrel, the respective targets are directed in a direction so that projections overlap each other before reaching the inner side wall.

2. The powder coating apparatus according to claim 1, wherein compositions of the respective targets are different from each other.

3. The powder coating apparatus according to claim 1,
wherein respective fixing portions are incorporated in a target unit to fix a relative orientation relation of the respective mounted targets, and
the target unit is attached to be rotatable around the main axis.

4. The powder coating apparatus according to claim 1, further comprising:
a powder rising suppression component disposed in contact with a side wall of a part of the inner side wall of the barrel which moves upward by rotation of the barrel to determine an upper limit position to which the powder gradually rises; and
a leveling component for the powder disposed at an interval from the inner side wall of the barrel at a position lower than the powder rising suppression component to perform swinging motion about the main axis as a rotation center.

5. The powder coating apparatus according to claim 4, wherein the powder rising suppression component corresponds to a brush or a spatula.

6. The powder coating apparatus according to claim 4, wherein the leveling component corresponds to a bar or a plate.

7. The powder coating apparatus according to claim 4, wherein when the leveling component performs swinging motion in an opposite direction to a rotation direction of the barrel, the leveling component turns back at a lowest position on the inner side wall of the barrel or a position beyond the lowest position.

8. The powder coating apparatus according to claim 4, wherein when the leveling component performs swinging motion along the rotation direction of the barrel, the leveling component turns back below the powder rising suppression component.

9. The powder coating apparatus according to claim 1, wherein the sputtering device is capable of rotating about the main axis to adjust an angle.

10. The powder coating apparatus according to claim 4, wherein the powder rising suppression component is fixed by being connected to a portion of the sputtering device corresponding to neither the target nor a part electrically connected to the target or by being connected to a part modularized with the sputtering device.

11. The powder coating apparatus according to claim 4, wherein when a position of each of the powder rising suppression component, the leveling component, and the target is represented on polar coordinates on a cross section vertically traversing the main axis and passing through the powder rising suppression component, the leveling component, and the targets, a position of the main axis is set to an origin O of the polar coordinates, a vertical downward line passing through the main axis is set to a start line of an angle 0°, and the rotation direction of the barrel is set to a direction forming a positive angle with respect to the start line, and when an angle at which the powder rising suppression component is fixed is set to $\beta$, an angle 1 of a line corresponding to a normal line of a target surface located at a center or an extension line thereof and intersecting the main axis is set to $\theta$ in a case in which an odd number (however, excluding 1) of targets are provided on the cross section, or an angle 2 of a line connecting the main axis and a point at which normal lines of two target surfaces located at a center or extension lines thereof intersect each other is set to $\theta$ in a case in which an even number of targets are provided on the cross section, and a maximum angle of a swing width of swinging of the leveling component is set to $\alpha_1$ in a positive direction and to $\alpha_2$ in a negative direction with respect to a line having the angle $\theta$, the angle $\beta_{13}$, the angle $\theta$, the angle $\alpha_1$, and the angle $\alpha_2$ satisfy Formula 1, Formula 2, Formula 3, and Formula 4:

(Formula 1) $0°<\beta-(\theta+\alpha 1)<45°$
(Formula 2) $90°\leq\beta<135°$
(Formula 3) $0°\leq\theta\leq45°$
(Formula 4) $0°<\alpha 2<60°$.

12. The powder coating apparatus according to claim 11, further comprising
a first angle adjustment mechanism which changes an inclination $\theta$ of the target and is capable of fixing the inclination at any angle in an angle range of Formula 3.

13. The powder coating apparatus according to claim 11, wherein the powder rising suppression component
is fixed while being disposed above an intersecting part between a line extending the target surface located at the center and the inner side wall of the barrel in the case in which the odd number (however, excluding 1) of targets are provided on the cross section, or
is fixed while being disposed above an intersecting part between a line connecting both ends of the two target surfaces located at the center facing each other and the inner side wall of the barrel in the case in which the even number of targets are provided on the cross section.

14. The powder coating apparatus according to claim 11, further comprising
a first angle adjustment mechanism which changes an inclination $\theta$ of the target and is capable of fixing the inclination at any angle in an angle range of Formula 3,
wherein the powder coating apparatus further comprises a second angle adjustment mechanism capable of fixing the powder rising suppression component at a variable position above an intersecting part between a line extending the target surface located at the center and the inner side wall of the barrel in the case in which the odd number (however, excluding 1) of targets are provided on the cross section, or
the powder coating apparatus further comprises a second angle adjustment mechanism capable of fixing the powder rising suppression component at a variable position above an intersecting part between a line connecting both ends of the two target surfaces located at the center facing each other and the inner side wall of the barrel in the case in which the even number of targets are provided on the cross section.

15. The powder coating apparatus according to claim 11, further comprising
a first angle adjustment mechanism capable of fixing the target at a variable position in a range of including or partially overlapping the target by 0° or more and $\theta_{MAX}$ or less (where, $\theta_{MAX}$ satisfies Formula 5),
wherein the powder rising suppression component is fixed at a position above an intersecting part between a line extending the target surface located at the center and the inner side wall of the barrel when an inclination of the target is
set to $\theta_{MAX}$ in the case in which the odd number (however, excluding 1) of targets are provided on the cross section, or
is fixed at a position above an intersecting part between a line connecting both ends of the two target surfaces located at the center facing each other and the inner side wall of the barrel when an inclination of the target is set to $\theta_{MAX}$ in the case in which the even number of targets are provided on the cross section:
(Formula 5) $0°<\theta_{MAX}\leq45°$.

16. The powder coating apparatus according to claim 1, wherein the length of each respective target is identical.

* * * * *